(12) United States Patent
Frosien

(10) Patent No.: US 7,544,937 B2
(45) Date of Patent: Jun. 9, 2009

(54) CHARGED PARTICLE BEAM DEVICE FOR HIGH SPATIAL RESOLUTION AND MULTIPLE PERSPECTIVE IMAGING

(75) Inventor: Juergen Frosien, Riemerling (DE)

(73) Assignee: ICT Integrated Circuit Testing Gesellschaft fur Halbleiterpruftechnik GmbH, Heimstetten (DE)

( * ) Notice: Subject to any disclaimer, the term of this patent is extended or adjusted under 35 U.S.C. 154(b) by 506 days.

(21) Appl. No.: 11/384,043

(22) Filed: Mar. 17, 2006

(65) Prior Publication Data

US 2006/0226360 A1    Oct. 12, 2006

(30) Foreign Application Priority Data

Mar. 17, 2005    (EP)    ................... 05005887

(51) Int. Cl.
  H01J 37/244    (2006.01)
  H01J 37/256    (2006.01)
  H01J 37/28     (2006.01)
(52) U.S. Cl. ........................ 250/310; 250/397
(58) Field of Classification Search ............... None
  See application file for complete search history.

(56) References Cited

U.S. PATENT DOCUMENTS

| 4,246,479 A |   | 1/1981  | Gopinathan |
| 4,675,524 A | * | 6/1987  | Frosien et al. .............. 250/310 |
| 4,812,651 A |   | 3/1989  | Feuerbaum et al. |
| 4,831,267 A | * | 5/1989  | Brunner ..................... 250/397 |
| 4,926,054 A | * | 5/1990  | Frosien ..................... 250/396 R |
| 5,789,748 A | * | 8/1998  | Liu et al. ................... 250/310 |
| 6,667,476 B2 |   | 12/2003 | Todokoro et al. |
| 2003/0127604 A1 |   | 7/2003  | Todokoro et al. |

FOREIGN PATENT DOCUMENTS

| DE | 1995330 A1    | 5/2005 |
| JP | 61135035      | 6/1986 |
| JP | 2000164167 A  | 6/2000 |

OTHER PUBLICATIONS

European examination report dated Dec. 18, 2006.
European search report dated Jan. 31, 2006.
T.-T. Tang et al. "A combined objective lense-energy analyser for electron beam testing of IC," Journal of Electron Microscopy, 1998 vol. 47(1): pp. 1-7.
W. LIU et al. "Micro-objective lens with compact secondary electron detector for miniature low voltage electron beam systems." J. Vac. Sci. Technol. B. Nov./Dec. 1996 vol. 14(6): pp. 3738-3741.

* cited by examiner

Primary Examiner—Jack I. Berman
(74) Attorney, Agent, or Firm—Patterson & Sheridan, L.L.P.

(57) ABSTRACT

The present invention relates to a charged particle device with improved detection scheme. The device has a charged particle source providing a beam of primary charged particles; a first unit for providing a potential; a second unit for providing a potential; and a center unit positioned between the first unit and the second unit. The center unit is capable of providing a potential different from the potential of the first and the second unit for decelerating the primary charged particles to a first low energy and for accelerating the primary charged particles to a second high energy. Therein, the first unit and/or the second unit is a detector for detecting secondary electrons released at a specimen.

31 Claims, 11 Drawing Sheets

CHARGED PARTICLE BEAM DEVICE FOR HIGH SPATIAL RESOLUTION AND MULTIPLE PERSPECTIVE IMAGING

FIELD OF THE INVENTION

The invention relates to charged particle optics. Especially, the invention relates to charged particle beam devices for inspection system applications, testing system applications, lithography system applications and the like. Further, the invention concerns a scanning electron microscope for low voltage applications. More specifically, the invention relates to charged particle beam devices and to methods of operation thereof.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Thereby, care has to be taken that a specimen under investigation is not damaged. Thus, low voltage microscopy is important for the imaging of sensitive and non-conductive specimen. Due to the low energy (typically lower than 5 keV) of the primary charged particles, resulting in low energy dissipation, sensitive specimens are not damaged. Additionally, the charging behavior of the insulating specimen can be advantageous for low voltages because the secondary electron emission can be controlled to be equal to the primary electron absorption of the specimen. Low voltage microscopy is, thus, interesting for the dimensional measurement and the inspection of device structures in the semiconductor manufacturing process.

Presently, high resolution low voltage microscopes are used for the above mentioned applications. Prior art systems, as e.g. described in EP-B-0 333 018, use a combined electro-static-magnetic immersion lens as final objective lens. Immersion lenses allow for high beam energies within the column and lower beam energies on impingement on a specimen. Thereby, reduction of the Boersch effect and reduced beam landing energies can be combined.

The back-scattered and/or secondary charged particles released on impingement of primary charged particles on a specimen can be detected by a detector located within the objective lens or above the objective lens. This arrangement of an in-lens or pre-lens detector has the advantage that the specimen can be located very close to the lens, resulting in a short working distance. A short working distance results in improved imaging properties, especially improved resolution.

State of the art systems, as e.g. described in U.S. Pat. No. 5,780,859, have a drawback in secondary electron detection efficiency, since an immersion lens accelerates the secondary charged particles to a potential comparable to the deceleration potential for the primary charged particle beam. In view of the high secondary charged particle energy, the detection of these particles is more difficult. Therefore, state of the art solutions either use coaxial detectors with small holes for the penetration of the primary beam (EP-B-0 333 018) or means for separation of the primary and the secondary electron beam (U.S. Pat. No. 5,422,486).

It is an object of the invention to provide a charged particle beam device overcoming the problems and disadvantages in the state of the art. Furthermore, it is an object of the present invention to provide a method for operating a charged particle beam device that overcomes at least some of the problems in the state of the art.

SUMMARY OF THE INVENTION

According to one aspect of embodiments of the present invention, a charged particle beam device includes a charged particle source providing a beam of primary charged particles, a first unit for providing a first potential, a second unit for providing a second potential, and a center unit positioned between the first unit and the second unit, capable of providing a third potential different from the first and second potential to decelerate primary charged particles that arrive from a direction of the first unit to a first low energy and to accelerate the primary charged particles that propagate towards the second unit to a second high energy, wherein the first unit and/or the second unit is a detector for detecting charged particles released at a specimen.

According to another aspect of embodiments of the present invention, a method for operating a charged particle beam device includes providing a first potential at a first unit, providing a second potential at a second unit, providing a third potential at a center unit, generating a beam of primary charged particles, generating a beam of secondary and/or backscattered charged particles, wherein providing the third potential is adopted to decelerate the primary charged particles arriving from the first unit and to accelerate the primary charged particles towards the second unit, wherein providing the third potential is carried out at a position between a position of providing the first potential and a position of providing the second potential, and detecting the secondary and/or backscattered charged particles at the first unit and/or second unit.

According to another aspect of embodiments of the present invention, a method for analyzing a specimen includes providing a first potential at a first unit, providing a second potential at a second unit, providing a third potential at a center unit, generating a beam of primary charged particles, generating a beam of secondary and/or backscattered charged particles, wherein providing the third potential is adopted to decelerate the primary charged particles arriving from the first unit and to accelerate the primary charged particles towards the second unit, wherein providing the third potential is carried out at a position between a position of providing the first potential and a position of providing the second potential, detecting the secondary and/or backscattered charged particles at the first unit and/or second unit providing a specimen, and directing the beam of primary charged particles to the specimen, thereby generating the beam of secondary and/or backscattered charged particles.

Further advantages, features, aspects and details of the invention are evident from the dependent claims, the description and the accompanying drawings.

According to one aspect of the present invention, a charged particle beam device is provided with:
charged particle source providing a beam of primary charged particles;
a first unit for providing a potential;

a second unit for providing a potential;

a center unit positioned between the first unit and the second unit, being capable of providing a potential different from the potentials of the first and the second unit for decelerating the primary charged particles to a first low energy, wherein the first unit and/or the second unit is a detector for detecting charged particles released at a specimen.

Charged particles feel rejection forces originating from the other charged particles. Hence the beam of primary charged particles widens on its way. As this problem cannot be overcome in principle, it is, however, desirable to shorten the flight time of each charged particle between source and specimen. This can be done by reducing the length of the column and by increasing the mean kinetic energy of the charged particles. In particular, the column portion in which the charged particles have low kinetic energy should be minimized. The present invention provides a detection module, wherein the primary charged particles, that may trespass the detection module for detecting the secondary and/or backscattered particles are decelerated in a limited area. Beam deceleration of the primary charged particle beam is performed between first unit and center unit, and beam acceleration of the primary charged particle beam is performed between center unit and second unit. Typically, the distance between the first unit and the second unit is less than 30 mm or even smaller than 25 or 20 mm. Hence, the area in which the primary charged particle beam is slow is minimized, thereby reducing the electron-electron interaction.

According to a further aspect, the first unit, the second unit and the center unit form a detection module and the charged particles are decelerated and accelerated in the detection module.

Yet according to a further aspect, the primary charged particles are accelerated after generation of the primary charged particle beam to a first high energy, are decelerated and again accelerated to a second high energy in the detection module and are again decelerated before impingement on a specimen.

Increased performance is to be expected because most of the primary beam path is at a high energy level. Furthermore, the pre-lens detector location provides for a short focal length and a low aberration coefficient. By having a low energy level in the region of the detector, a high back-scattered and/or secondary electron detection efficiency can be realized and the present apparatus is especially useful for signal capturing from the bottom of holes in specimens (e.g. contact holes in semiconductor technology).

In view of the above, the resolution can be improved due to the reduced electron-electron-interaction and the electron detection efficiency can be improved by the detection scheme.

According to another aspect of embodiments of the present invention, the first unit is a detector. The secondary electrons arriving from the specimen are decelerated by the center unit. If the center unit is negatively charged in comparison to the specimen, the secondary electrons feel a potential barrier. Those secondary electrons that can overcome this barrier are accelerated to the first unit where they are detected.

According to another aspect of embodiments of the present invention, the second unit is a detector. Typically, at least the detection side of the second unit, which is facing the center unit, is sensitive for detection. Hence, secondary electrons with less energy than necessary to overcome the potential barrier are reversed towards the second unit where they are detected.

According to another aspect of embodiments of the present invention, both the first and the second unit are detectors.

According to still further aspect, the center unit, which may be in the form of a ring or cylinder, may then be segmented, typically in four segments. Thereby, a beam adjustment with respect to beam direction or beam position can be realized.

According to a further aspect of embodiments of the present invention, the charged particle beam device comprises a third unit, wherein the third unit is a detector arranged adjacent to the second unit. Typically, the sensitive side of the second unit is oriented towards the center unit whilst the sensitive side of the third unit is oriented towards the specimen.

According to a further aspect of embodiments of the present invention, the first unit, the center unit, the second unit and the optional third unit are combined into one module.

According to one aspect of embodiments of the present invention, the energy of the primary charged particles when impinging on the specimen, i.e. the final beam energy, is in the same order of magnitude as the first low energy that the primary charged particles have when being at the center unit; most typically those energies are approximately the same. The final beam energy on impingement onto a specimen is lower than 5 keV, typically lower than 1 keV. The first high energy and the second high energy are typically in the same order of magnitude; most typically they are approximately the same. Those high energies are about between 5 keV and 30 keV. Typically, the first and/or the second high energy are at least three times, e.g. ten times higher than the final beam energy.

The center unit can be a grid, a tube, a ring, a cylinder, a hole-shaped electrode or the like. Every means for providing a potential and for allowing the charged particles to pass through is possible. Typically, grid electrodes may be applied which can have one or more additional hole(s) for the penetration of the primary charged particles, and which may be bent in a planar, convex or concave shape.

Typically, the first unit and the second unit are located close to a crossover of the beam of primary charged particles. Thereby, impact of the detector on the primary beam can be minimized.

In general, the first unit, the second unit and/or, if existent, the third unit can be annular detectors. The detectors may optionally be segmented and have typically a hole for primary charged particle penetration. The detectors may be scintillation detectors, channel detectors, pin diodes or the like. The detectors may have annular, azimuth, e.g. quadrant, or combined annular-azimuth segments. The second unit may be a detector, which is sensitive from both sides. If a third unit is applied, the second unit is typically a detector which is sensitive on the side facing the center unit, and the third unit is a sensitive detector on the side that is oriented towards the specimen.

The detection module (detection scheme) included in the device can combine a high efficiency and an angular resolution as well as energy-resolution. Thereby, a resolution in the nanometer-range or sub-nanometer range may still be obtained by the immersion lens technology.

According to further aspects of embodiments of the present invention, the charged particle beam device comprises a condenser lens. This lens can be an electrostatic, a magnetic or a compound electrostatic magnetic lens. The condenser lens may be combined with the acceleration component that is disposed after the charged particle beam source, into one module. Moreover, the first unit and the center unit may additionally act as condenser lens integral part.

It is another aspect of embodiments of the present invention that the charged particle beam device as described herein is used as a scanning electron microscope for low voltage applications. In this case, the primary charged particles are electrons and the secondary charged particles are secondary and/or backscattered electrons.

In another aspect of embodiments of the present invention a method for operating a charged particle beam device is provided, comprising the steps of:

directing a beam of primary charged particles onto a specimen, thereby generating a beam of secondary charged particles;

accelerating the primary charged particles to a first high energy;

decelerating the primary charged particles to a first low energy;

accelerating the primary charged particles to a second high energy;

generating a beam of secondary charged particles;

providing a potential for directing the secondary charged particles to a first unit and/or a second unit;

detecting the secondary charged particles at the first and/or second unit;

wherein the potential for directing the secondary charged particles to a first unit and/or a second unit causes the decelerating of the primary charged particles to the first low energy and the accelerating of the primary charged particles to the second high energy.

According to another aspect of embodiments of the present invention, a method for analyzing a specimen is provided which comprises the further steps of providing a specimen and directing the beam of primary charged particles onto that specimen, thereby generating the beam of secondary charged particles.

The invention is further directed to methods for operating or manufacturing the disclosed methods. Further, the invention is also directed to apparatuses for carrying out the disclosed methods, including apparatus parts for performing each of the described method steps. Method steps may be performed by way of hardware components, a computer programmed by appropriate software, by any combination of the two, or in any other manner.

BRIEF DESCRIPTION OF THE DRAWINGS

Some of the above indicated, and other more detailed aspects of the invention, will be described in the following description and partially illustrated with reference to the figures. Therein.

DETAILED DESCRIPTION OF THE DRAWINGS

Within the following description of the drawings, the same reference numbers refer to the same components. Generally, only the differences with respect to the individual embodiments are described. It is to be understood that the drawings show only those elements which help understanding the invention.

Without limiting the scope of protection of the present application, in the following the charged particle beam device or components thereof might especially be utilized for electron microscope inspection or lithography. The present invention can still be applied for apparatuses and components using other sources of charged particles, e. g. ions, and/or other secondary and/or backscattered charged particles to obtain a specimen image.

Without any further clarification, potentials and voltages referred to in the application are understood as relative potentials in comparison to the potential of a specimen.

Typically, the charged particle beam device according to the present invention is adapted to work with secondary and/or backscattered electrons released by a specimen.

Secondary electrons result from inelastic collisions of the primary electrons with the outer electrons of specimen atoms. As a consequence, the electrons have enough energy to leave the respective shell. Their kinetic energy is in general low. Reflected or backscattered electrons are electrons of the primary beam that have been deflected by collisions with specimen atoms. Their typical energy range extends from the full primary electron energy down to the level of secondary electron energies. For the following discussion, there is no need to distinguish between secondary electrons and backscattered electrons. Therefore, secondary electrons and backscattered electrons will, for simplicity, be referred to as "secondary electrons" whenever a distinction is not necessary. Consequently, secondary charged particles and backscattered charged particles will be referred to as "secondary charged particles".

Figure 1A:
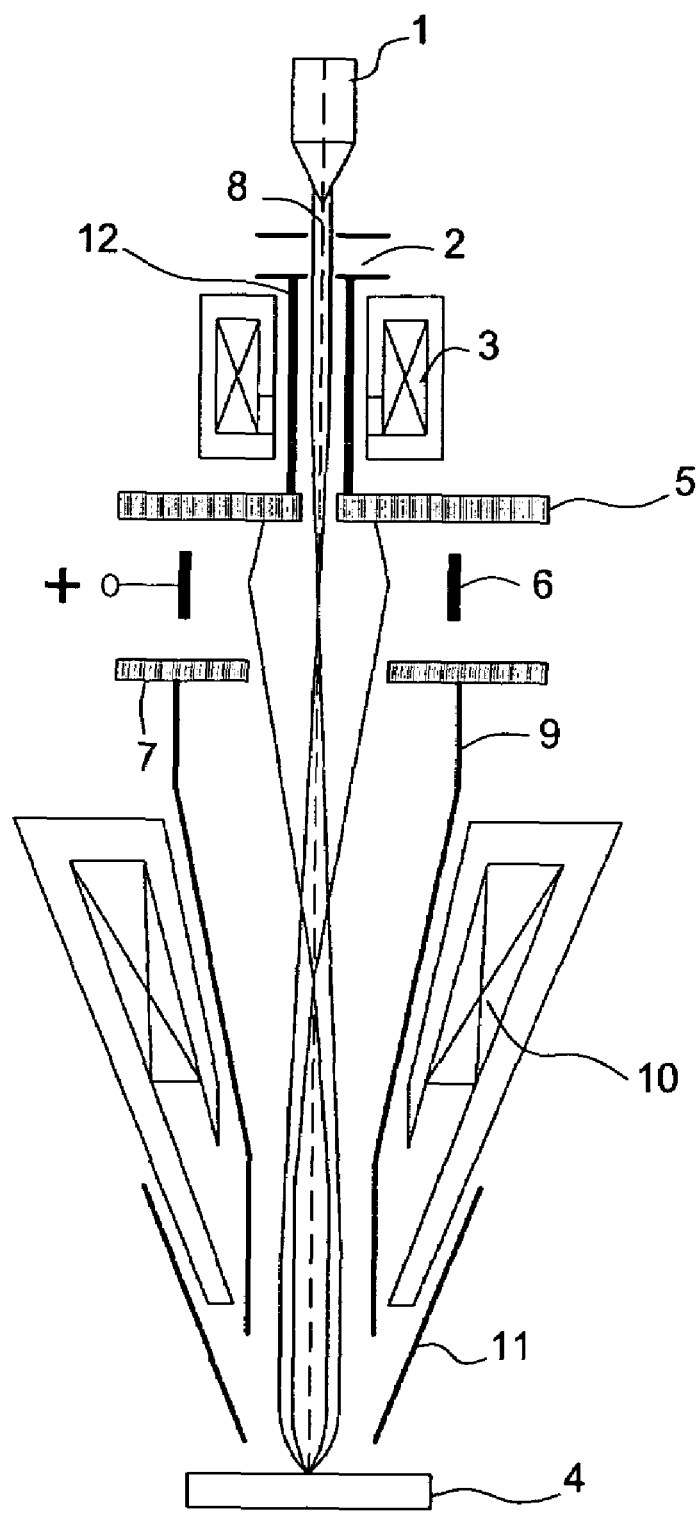
FIG. 1a shows a schematic view of a first embodiment of the charged particle beam device according to the present invention.

FIG. 1a shows a first embodiment of the present invention. The electron source 1 generates a beam of primary electrons 8 which are subsequently accelerated in the accelerator 2 to a high energy. Afterwards, the beam propagates within the column part 12, which is surrounded by the magnetic lens unit 3. The lens unit 3 generates a crossover of the beam 8 in the region close the first unit 5, i.e. a detector, and the second unit 7, i.e. an electrode. As shown in FIG. 1a, the crossover of the first embodiment is located within the center unit 6. Generally, without be limited to the present embodiment, the crossover is located in the detection module formed by the first unit 5, the second unit 7 and the center unit 6. The column part 12 is in connection with the first unit 5, that is first detector whose detection side is opposite to the side facing the column part 12. The lower electrode of acceleration unit 2, column part 12 and the first unit 5 have the same potential. This potential is, for instance, 5 kV, 10 kV or 20 kV. Values between or exceeding the examples given are also possible.

The center unit 6, shown as cylinder electrode, is connected to a positive potential. This potential is smaller than the potential of the first unit 5, which is a detector in this embodiment. Hence, the beam of primary charged particles 8 is decelerated between detector and cylinder electrode. The subsequently arranged second unit 7, e.g. an electrode or second detector, is on a higher potential than the center unit 6. The charged particles 8 are accelerated in the region between cylinder electrode and the second unit 7 and keep this energy on their way down towards the specimen until they reach the lower end of the electrode 9. Electrode 9 and the electrode forming the second unit 7 have the same potential. The first unit and the second unit act in addition to any detection ability as deceleration and acceleration means. The electrode 11 acts as a retarding electrode. Thereby, the primary electrons are decelerated to realize a low voltage application. Electrode 9 and electrode 11 form a deceleration unit due to the potential difference there between. The charged particle beam device includes a focusing objective lens 10.

In general, and not limited to the embodiment of FIG. 1a, the particle beam source is typically an electron beam source like a thermal emitter, a cold or thermal field emitter, a Schottky emitter or a photocathode. For systems including a beam boost of the primary charged particle beam, the energy after the accelerator and the energy after the second detector is significantly higher than the final landing energy on the specimen after the retarding field electrode. Typically, but not necessarily, the energy of the primary charged particles after the accelerator is similar or identical to the energy of the primary charged particles after the second detector. Furthermore, the energy of the primary charged particles at the center unit is reduced as compared to the energy after the accelerator. This energy may be chosen to be similar or identical to the final landing energy.

In general and not limited to the embodiment of FIG. 1a, it would be possible to apply a hole-shaped electrode, a ring electrode or a grid electrode instead of the cylinder electrode as the center unit 6. One example is the grid electrode shown in FIG. 1b. Such a grid can be provided with a central hole for a better penetration of the beam of primary charged particles.

In general and also not limited to the embodiment of FIG. 1a, the detectors described herein can be scintillation detectors, channel detectors, pin diodes or other detectors suitable for detection of secondary particles released at the specimen.

Second unit 7 could also be a detector. In case of a negatively biased center unit 6 reversed secondary electrons can then be detected by the lower detector. Examples for those embodiments are given with respect to e.g. FIGS. 2a and 2b.

Figure 1B:
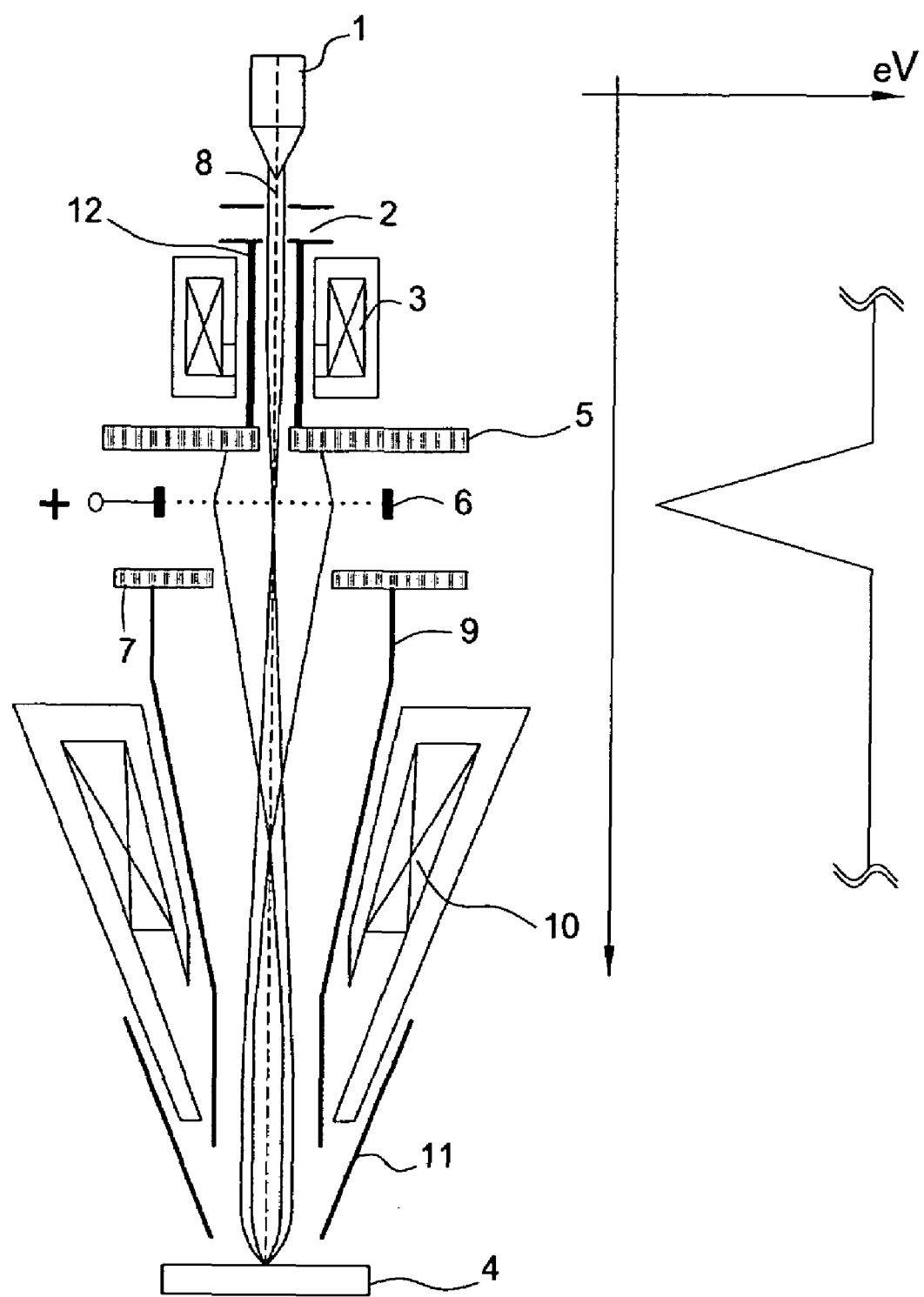
FIG. 1b shows a schematic view of a second embodiment of the charged particle beam device according to the present invention.

FIG. 1b differs from FIG. 1a in that the center unit 6 is shown as a grid electrode. Further, an energy diagram is shown on the right hand side of the drawing visualizing the typical energy of a primary charged particle on its way from the source 1 to the specimen.

The particles are accelerated to a beam boost potential on their path to most parts of the column. Typically, this energy is above 5 keV, for instance, 12 keV. The electrons keep this energy until the lower side of the first unit 5, the detector, which may have the same potential as the lower electrode of the acceleration unit 2. However, it shall be added that the lower electrode of the acceleration unit 2, column part 12 and detector need not necessarily have the same potential. For example, if column part 12 is not in contact with acceleration unit 2 and detector, column part 12 could have an energy even higher than the acceleration unit 2 and the detector.

Center unit 6 has a smaller potential. Consequently, the electrons 8 are slowed down. At the grid they reach their point of lowest kinetic energy. After the grid, or, in case of a cylinder as shown in FIG. 1a, after the cylinder electrode, they are again accelerated towards the second unit 7 whose potential is essentially higher than the potential of center unit 6. In the energy diagram of FIG. 1b, the kinetic energy of the particles after the electrode 7 is identical to their energy between the lower electrode of the accelerator 2 and the first unit 5, that is the first detector. This is, however, to be understood only as an example: different potentials can be applied to the respective devices 2, 12, 5, 7, 9 and thus different kinetic energies are in general possible.

The electrons keep this kinetic energy until the lower end of the column part 9. Between this end and the retarding electrode 11 they are decelerated to their final energy with which they are supposed to impinge on the specimen 4.

The embodiments shown in FIGS. 1a and 1b may as well include additional components (not shown) such as condenser lenses, deflectors of the electrostatic, magnetic or compound electrostatic-magnetic type, such as Wien filters, scanning deflectors of the electrostatic, magnetic or compound electrostatic-magnetic type, stigmators of the electrostatic, magnetic or compound electrostatic-magnetic type, further lenses of the electrostatic, magnetic or compound electrostatic-magnetic type, and/or other optical components for influencing and/or correcting the beam of primary and/or secondary charged particles, such as deflectors or apertures. Indeed, for illustration purposes, some of those components are shown in some of the following drawings. It is to be understood that they could also be applied in the other embodiments.

Figure 2A:
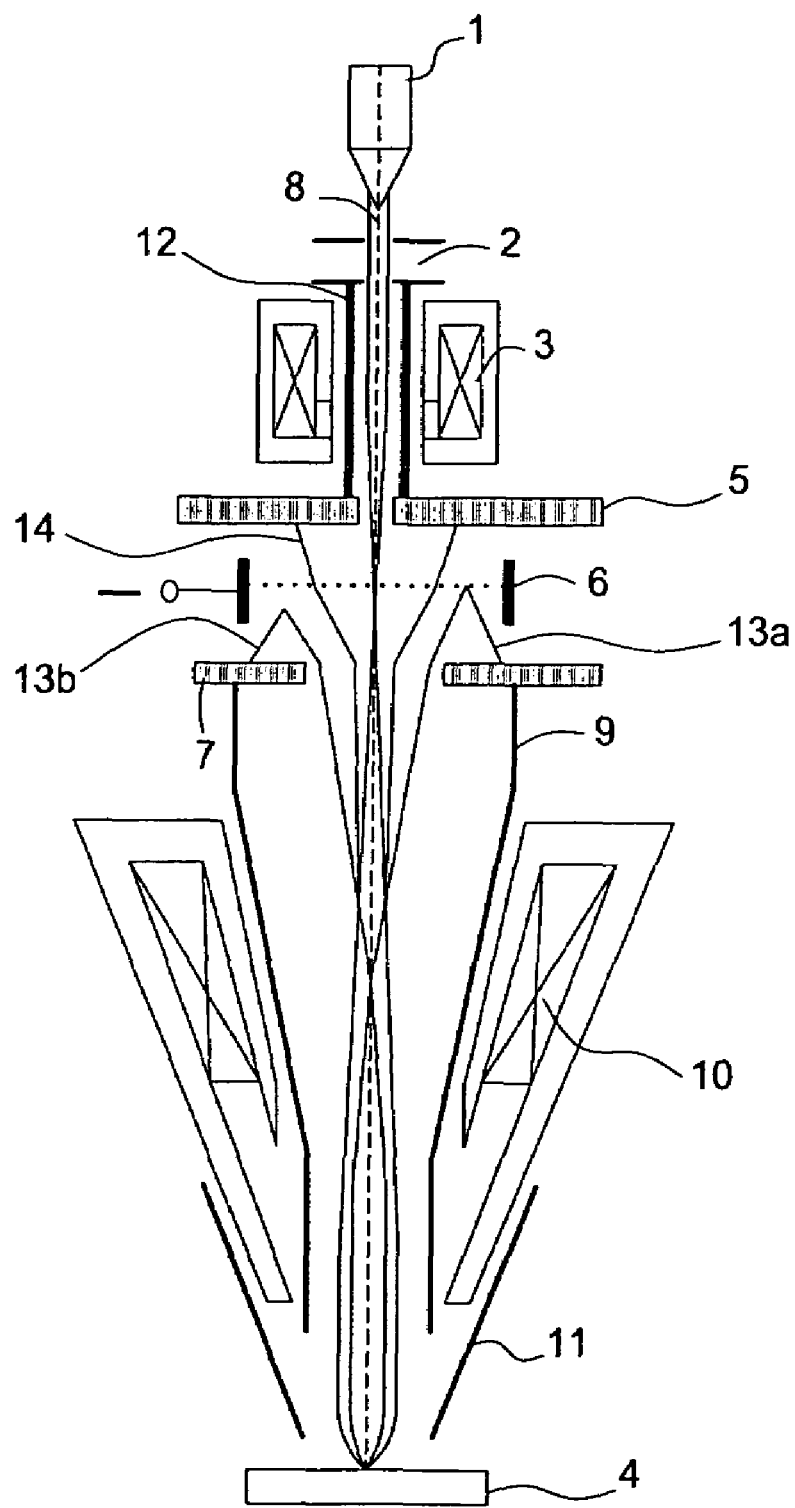
FIGS. 2a, 2b show schematic views of a third and fourth embodiment of the charged particle beam device according to the present invention.

FIG. 2a shows a similar embodiment as FIG. 1b. However, the center unit 6, shown as grid, is biased negatively this time. Hence, the beam of primary charged particles released at the source 1 is decelerated at a larger amount in comparison to the deceleration of FIG. 1b. However, as it is accelerated directly after the grid towards the first unit 5, which is a detector, or second unit 7, which is a detector in the embodiment of FIG. 1b, this has little negative impact on the resolution due to electron-electron interaction.

Depending on their energy, the secondary electrons released at the specimen 4 are able to overcome the potential barrier caused by the center unit 6, or they are not. In case their energy is larger than the potential barrier, they pass the grid and are again accelerated towards the first unit 5, where they are detected. Those electrons are labeled with reference number 14 in FIG. 2a. Other secondary electrons are too slow to overcome the potential originating from the grid. Instead of continuing to travel upwards, they are redirected and travel towards the second unit 7, where they are detected. In FIG. 2a there are exemplarily shown two different particle paths: particles according to path 13a have almost enough energy to overcome the potential barrier. It is reversed close to or at the grid. Particles according to path 13b have less energy and are reversed earlier on their way to the grid. The particles are accelerated back to the second unit 7, where they are detected.

Figure 2B:
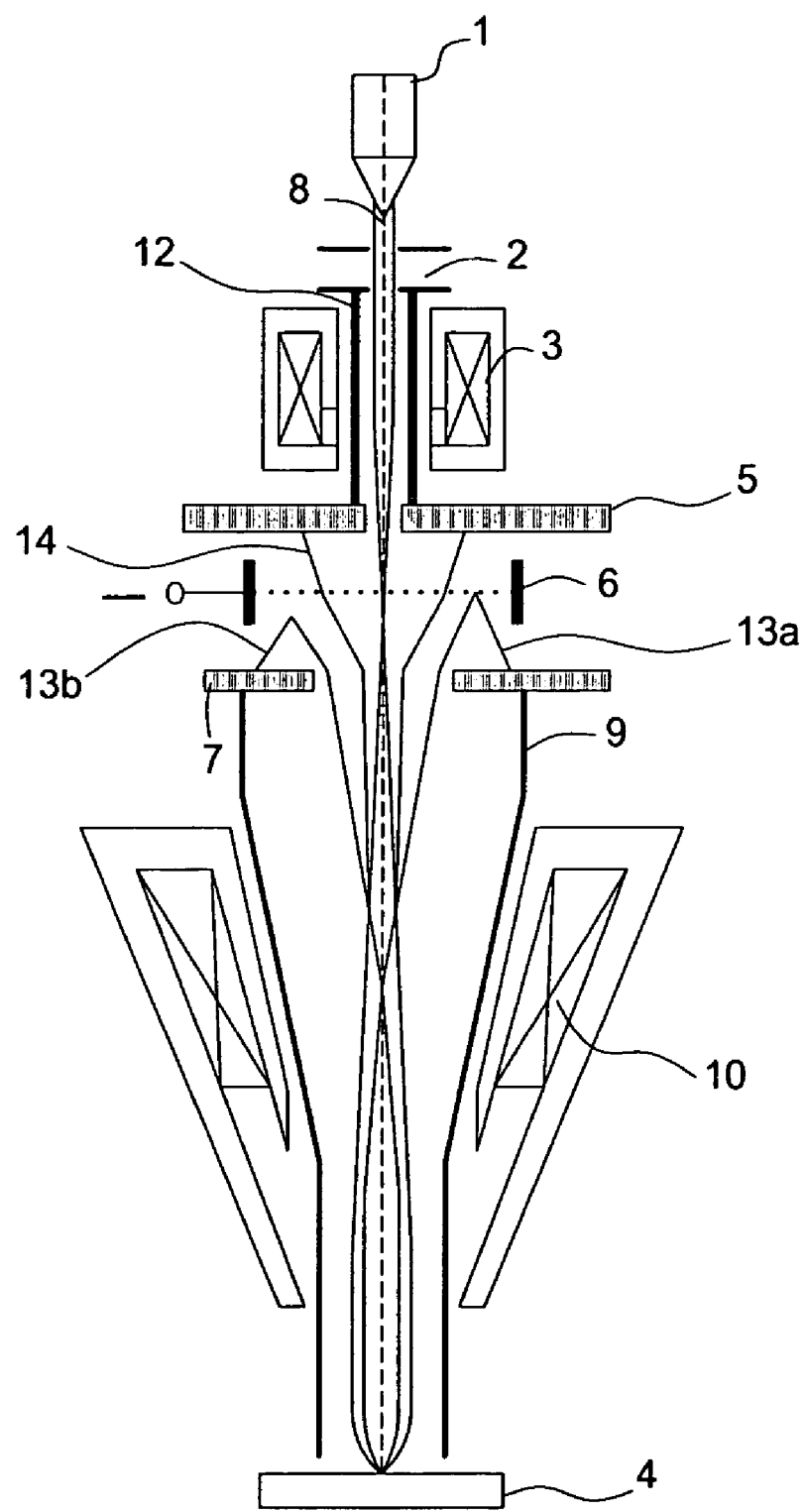

FIG. 2b differs from FIG. 2a in that there is no deceleration electrode 11. The retarding field for decelerating the primary charged particles is generated between electrode 9 of the focusing lens 10 and the specimen 4. The cylindrical shaped electrode 9 may have, for instance, between 7 and 10 kV, and the specimen could, for example, be at ground potential. A deceleration unit is, thus, be defined by electrode 9 and the specimen.

By adjusting the center unit voltage, the percentage and the angular distribution of electrons detected on the first and second unit can be controlled. This means that the information gathering process can be controlled according to the respective measurement task and/or specimen composition. In case of both the first and second unit being detectors, all signal electrons will be used as information input, i. e. there is no loss of electrons. Thus, there is no loss of information either. Depending on the potential of the center unit 6, the distribution of secondary electrons on the first or the second detector will be changed.

As shown by means of the embodiments set forth so far, the flow of secondary charged particles can be influenced and directed by applying suitable voltages to the center unit. As already mentioned above, the potential within the center unit in the following table must be understood relatively to the voltage of the specimen. In case of a grid as center unit, the voltage applied to the grid is identical to the potential within the center unit. In case of a cylinder or the like as center unit, the potential within the center unit generally differs from the voltage applied. In general, and not limited to the embodiments discussed, there are the following possibilities. For a deeper understanding, backscattered and secondary electrons are listed individually in the following:

TABLE 1

The effects of different center unit potentials and the information gained in the respective cases.

| Potential within center unit | Effect on detector signal | Information generated |
|---|---|---|
| 0 V or positive | All secondary and backscattered electrons reach the first detector. | Both topographical and material information. |
| Slightly negative (typically up to appr. 2 V) | All axial electrons reach the first detector, extremely large angle electrons reach the second detector. | Small topographical and material information on the first detector. Topographical information with moderate contrast |
| Moderate negative (typically up to appr. 5 V) | Small angle electrons reach the first detector, large angle electrons reach the second detector. | Material information on the first detector. Topographical information on the second detector with improved contrast. |
| More than 50 V negative | Only backscattered electrons reach the first detector, only secondary electrons reach the second detector. | Pure material information on the first detector. Pure topographical information on the second detector. |

In the table as well as in the following, the present invention shall be described with both the first and the second unit being detectors. Hence, the term "first detector" will be used synonymously to the term "first unit", the term "second detector" will be used synonymously to the term "second unit", and the term "third detector" will be used synonymously to the term "third unit".

Figure 3:
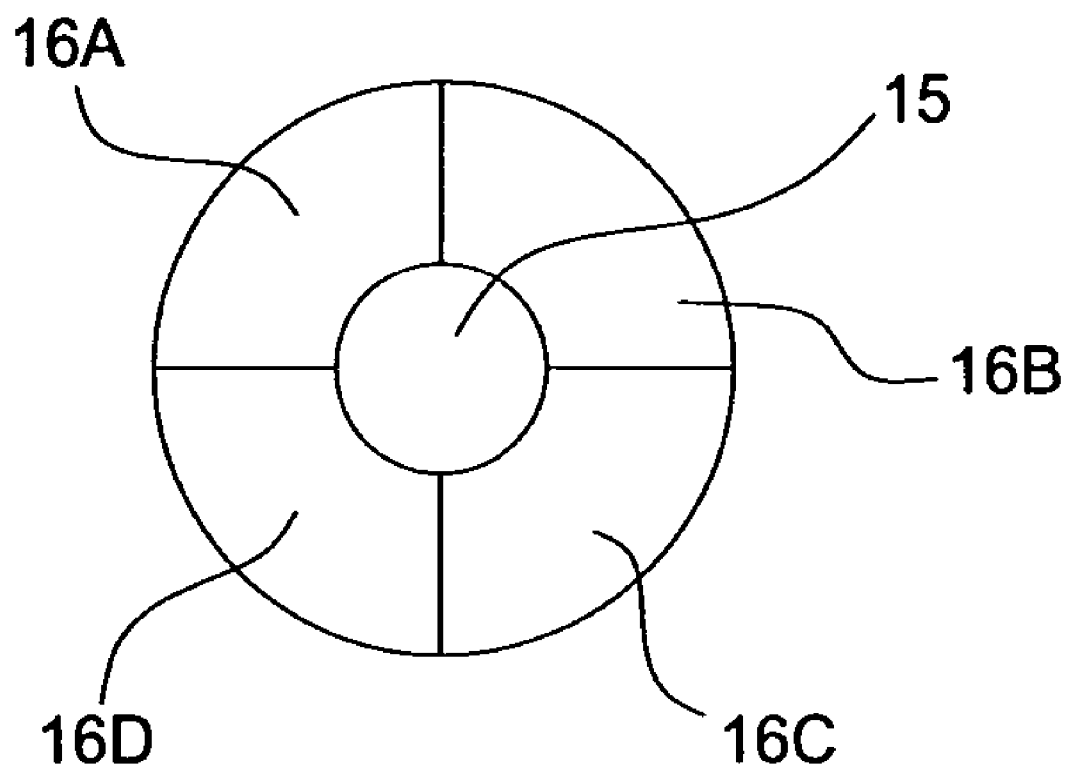
FIG. 3 shows a schematic view of a segmented detector usable within the other embodiments.

FIG. 3 shows a first, second and/or third detector that is segmented. A detector having a hole 15 for letting pass through the primary and, in case of the second or third detector, also the secondary charged particles, comprises four different segments 16*a-d*. Hence, the information described above can be gathered with additional directional sensitivity regarding the starting angle of the secondary electrons released from the specimen. In general, the detector can have two, four, eight or even more segments. The detectors are typically annular, azimuth or combined annular-azimuth segmented.

Figure 4:
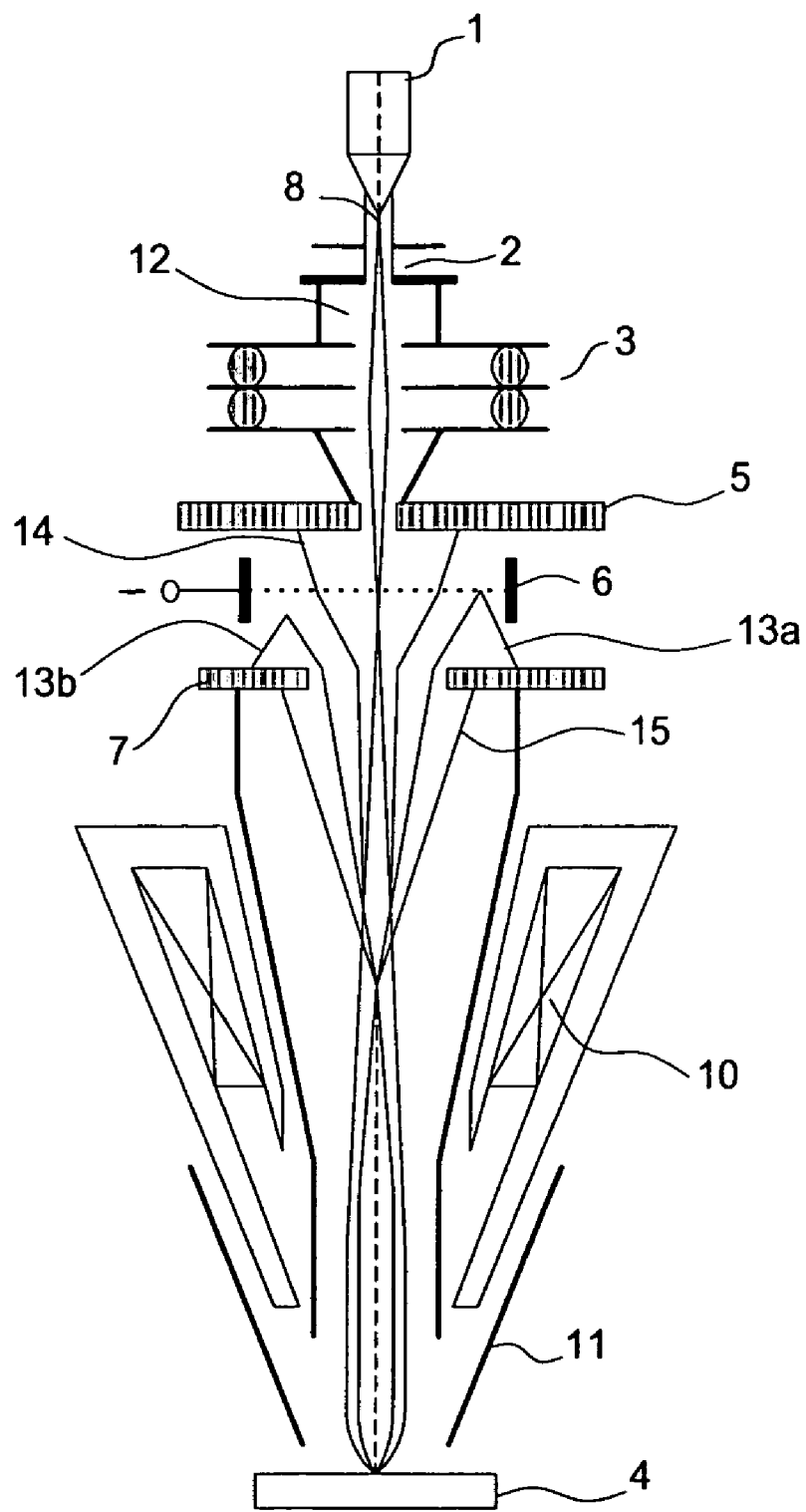
FIG. 4 shows a schematic view of a fifth embodiment of the charged particle beam device according to the present invention.

FIG. 4 shows another embodiment of the present invention. In comparison to FIGS. 2*a* and 2*b*, there are two differences. Firstly, an electrostatic condenser lens 3 is shown instead of the magnetic one. Secondly, an exemplary beam path 15 of a secondary electron with a large off-axial momentum is shown. The electrons traveling at a large angle do not reach the hole within the second detector and impinge on the lower side of the second detector. As the second detector is sensitive from the topside and the lower side these electrons can also be detected. In this case, the charged particle beam device according to the present invention provides for a very large angle detection from below.

Figure 5:
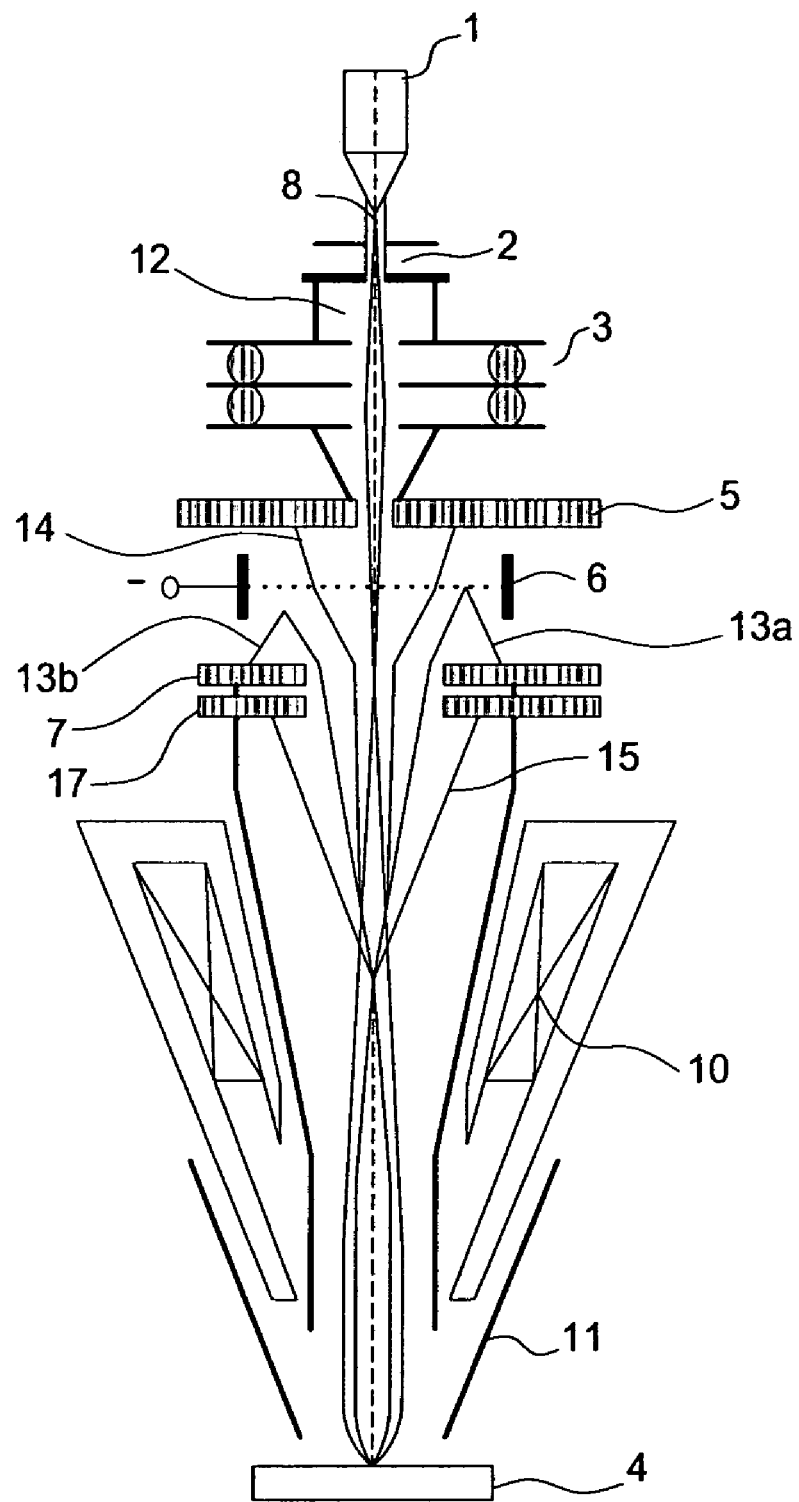
FIG. 5 shows a schematic view of a sixth embodiment of the charged particle beam device according to the present invention having a third detector.

Another large angle detection unit, which is capable of detecting electrons from below, is shown in FIG. 5. A third detector 17 adjacent to the second detector 7 is included. The third detector is sensitive on the side that is oriented towards the specimen. In FIG. 5, this is the lower side of the third detector 17. Hence, particles 15 with a large off-axial momentum are detected separately in this detector. In general and not limited to the embodiment of FIG. 5, it is typical that the second and/or third detector are segmented, typically in annular, azimuth or combined annular-azimuth segments.

Figure 6A:
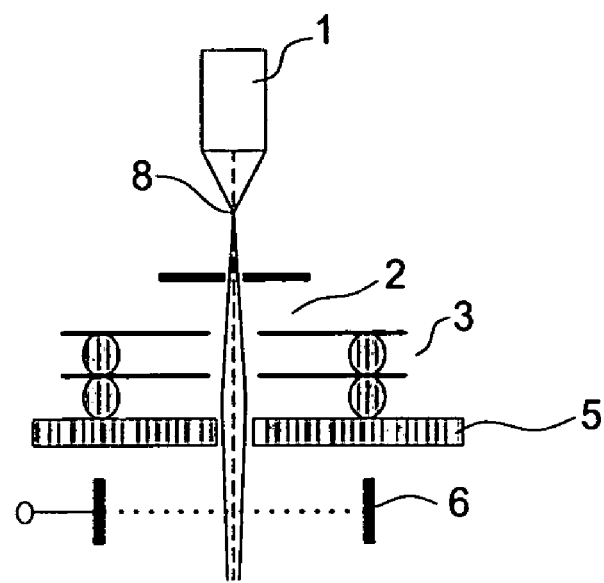
FIGS. 6a, 6b show schematic views of excerpts from a seventh and eighth embodiment of the charged particle beam device according to the present invention, wherein the excerpts show only the part between charged particle beam source and center unit.
Figure 6B:
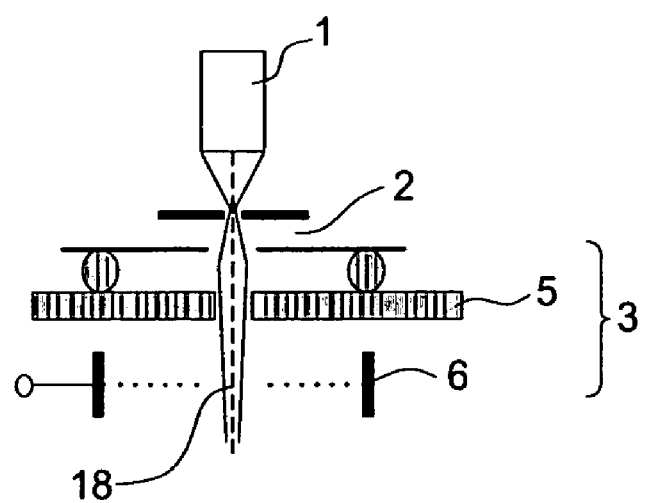

FIGS. 6*a* and 6*b* show excerpts from further embodiments of the charged particle beam device according to the present invention. Attention shall be drawn to the upper part of the charged particle beam device. FIG. 6*a* shows an embodiment, wherein the anode of the acceleration unit 2, the condenser lens 3 and the first unit are integrated into one component. The anode of the acceleration unit 2 is simultaneously the upper electrode of the condenser lens 3. First unit 5, being a detector, acts as the lower electrode of the condenser lens 3. The reduced column length achieved thereby further reduces the effective beam path.

In FIG. 6*b*, the center unit 6 is shown as a grid having a hole 18. This hole-shaped grid could also be used as the center unit in the other embodiments shown herein.

Further, FIG. 6*b* shows that the upper electrode of the electrostatic condenser 3 acts simultaneously as the extractor electrode of the acceleration unit 2. Furthermore, the upper detector acts as the focusing electrode of the condenser lens. The holed grid 6 acts as the third electrode of the condenser lens 3.

The parts of the system shown in FIGS. 6*a* and 6*b* may also be used instead of corresponding parts in other embodiments.

Figure 7:
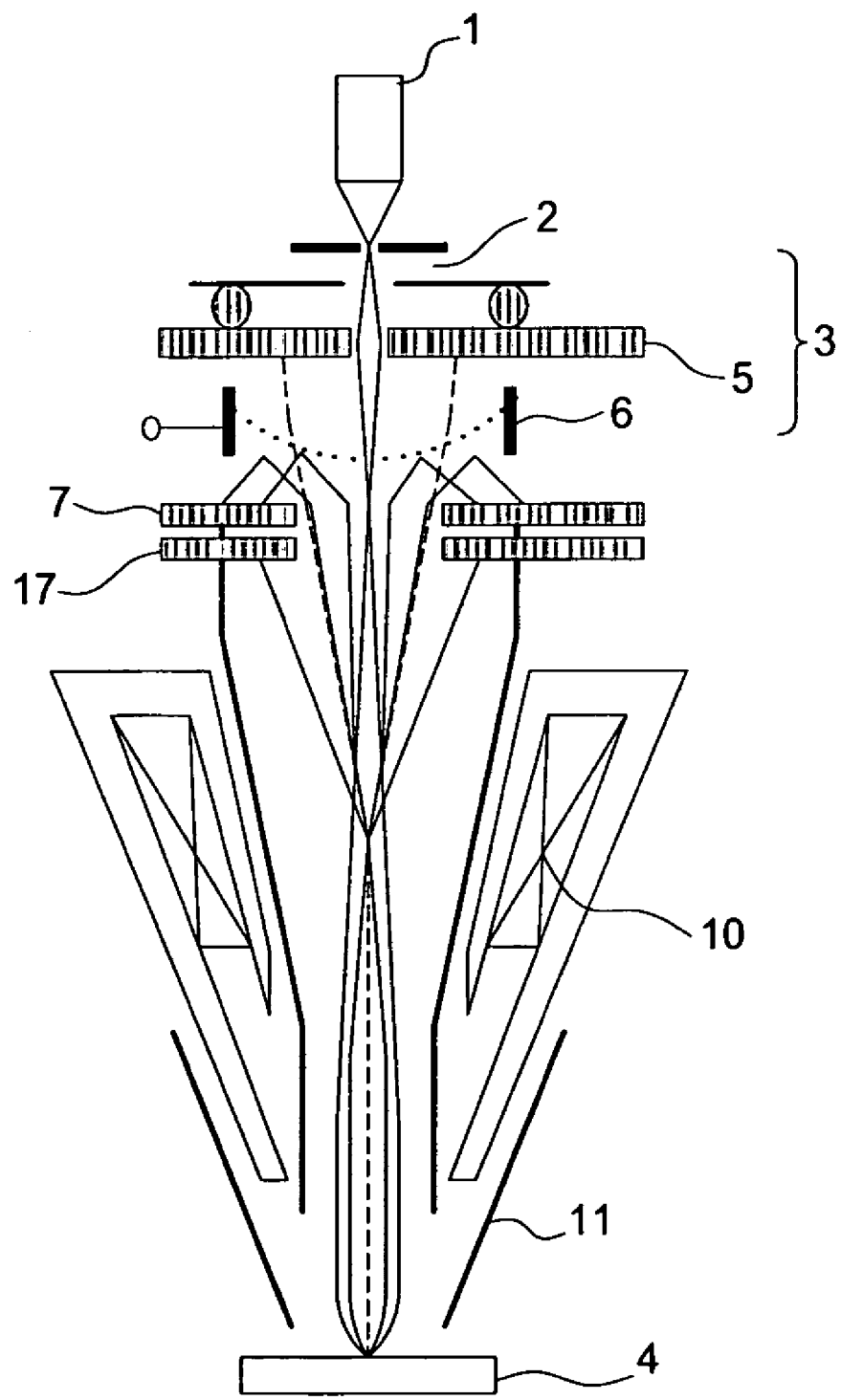
FIG. 7 shows a schematic view of a ninth embodiment of the charged particle beam device according to the present invention.

FIG. 7 shows a further embodiment of the present invention having a condenser lens as shown in FIG. 6*b*. Furthermore, the center unit 6 is shown as a curved grid. Thereby, the electrical field caused by the center unit and the surrounding detectors is shaped. The embodiment of FIG. 7 comprises additionally a third detector 17. However, this detector could also be omitted.

Figure 8:
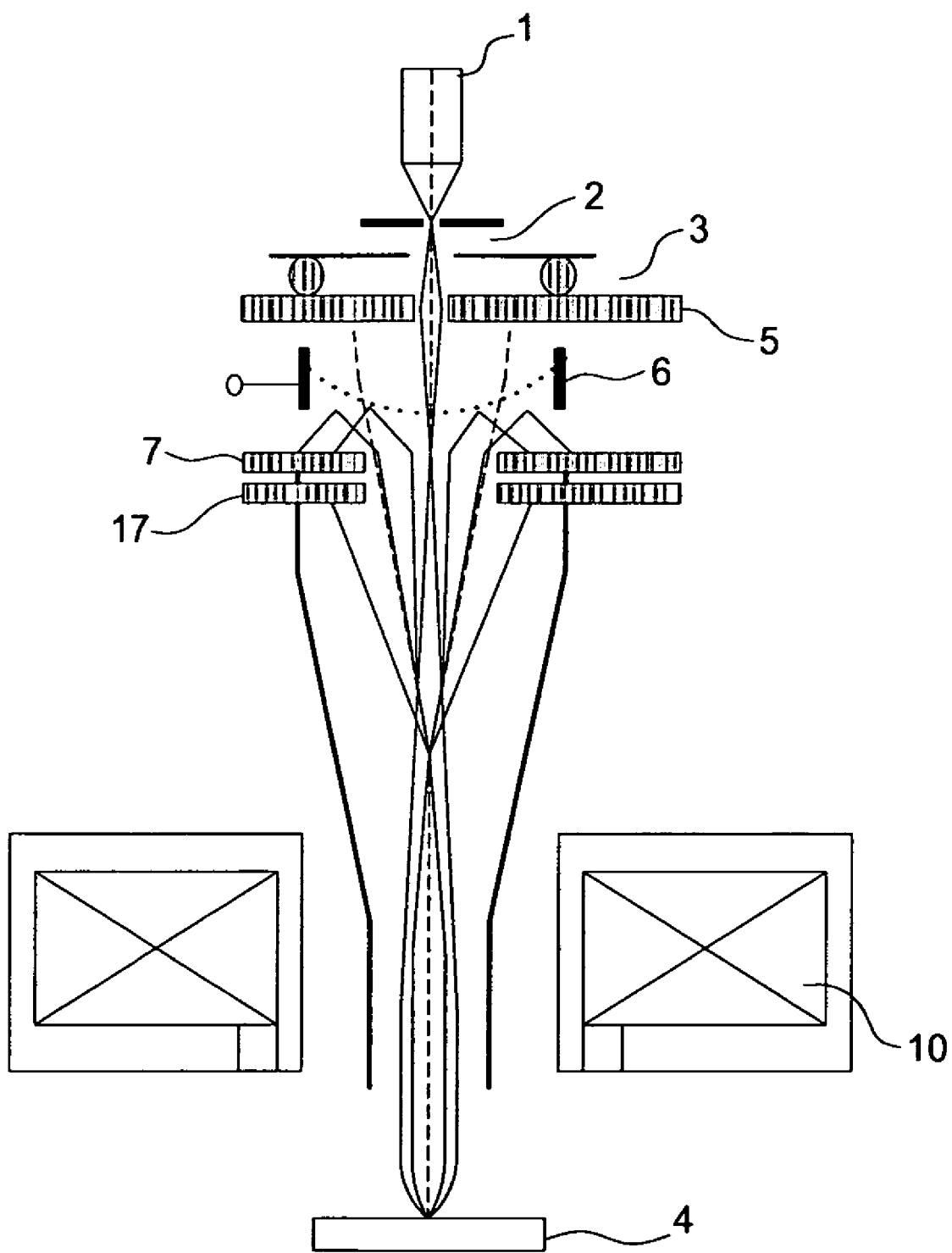
FIG. 8 shows a schematic view of a tenth embodiment of the charged particle beam device according to the present invention.

FIG. 8 shows a further embodiment of the present invention having a radial gap immersion lens 10. This kind of objective lens offers high resolution in those applications in which magnetic and electrical fields are tolerable at the specimen 4 surface. Generally and not limited to the embodiment of FIG. 8, all objective lens types may be combined with the detector systems shown above. Thereby, in view of the beam boost potential immersion lenses for reducing the beam landing energy may typically be used.

Figure 9:
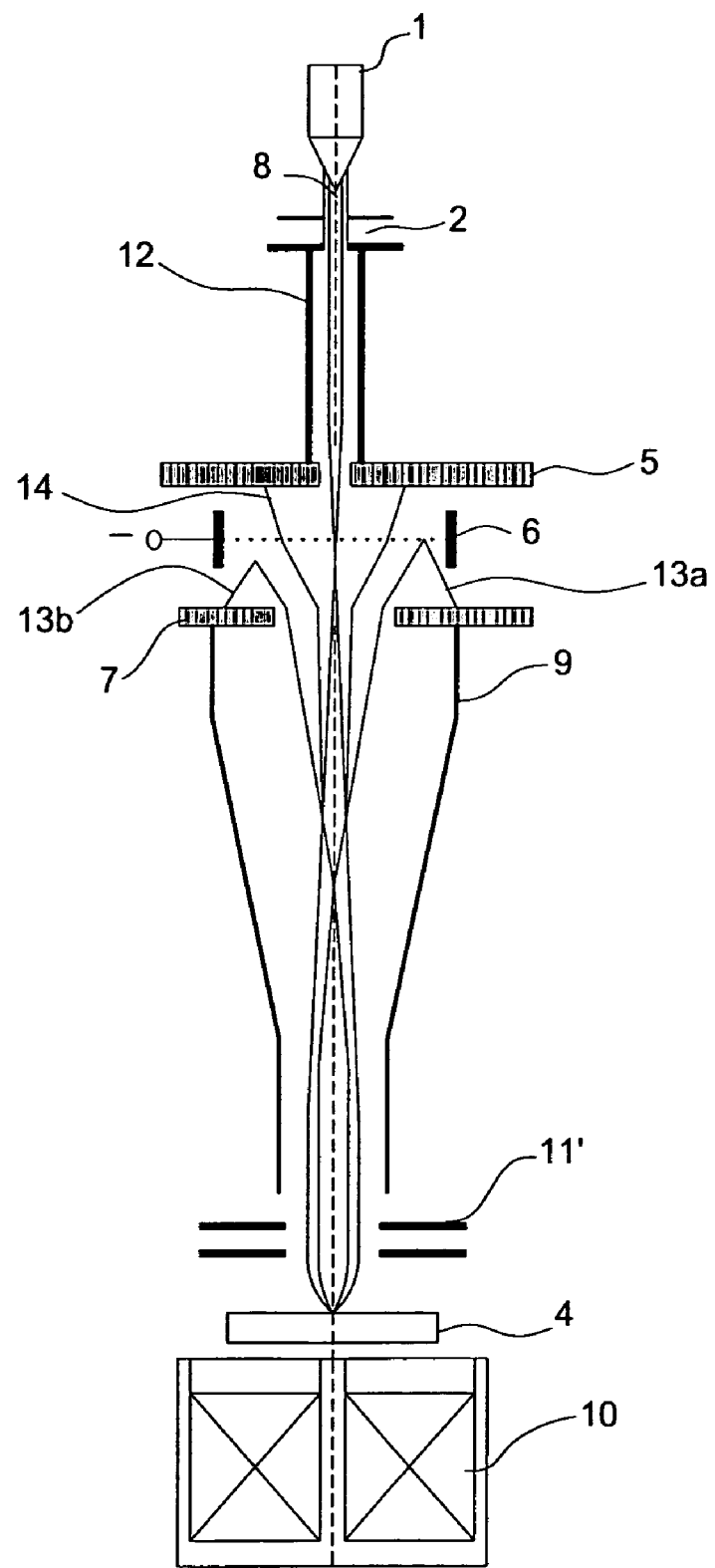
FIG. 9 shows a schematic view of a eleventh embodiment of the charged particle beam device according to the present invention.

FIG. 9 shows a further embodiment of the present invention. The charged particle beam device is depicted without condenser lens 3. Furthermore, the charged particle beam device has an immersion lens 11' for decelerating the primary particle beam to the final beam energy. The immersion lens is shown as an electrostatic lens. The electrostatic immersion lens consists typically of two or three electrodes. The focusing lens 10 is shown as a single pole magnetic lens, which is arranged under the specimen 4. This magnetic lens is, however, optional, and the immersion lens 11' alone would be sufficient for operation. Generally, in all embodiments, a scanning component (not shown) could be provided between the specimen and the objective lens or within the objective lens.

The invention claimed is:

1. A charged particle beam device comprising:
    a charged particle source providing a beam of primary charged particles;
    a first unit for providing a first potential;
    a second unit for providing a second potential; and
    a center unit positioned between the first unit and the second unit, the center unit capable of providing a third potential different from the first and second potential to decelerate primary charged particles that arrive from a direction of the first unit to a first low energy and to accelerate the primary charged particles that propagate towards the second unit to a second high energy, wherein the first unit or the second unit is a detector for detecting charged particles released at a specimen.

2. The charged particle beam device according to claim 1 further comprising:
    an acceleration unit for accelerating the primary charged particles to a first high energy, wherein the acceleration unit is positioned between the charged particle source and the first unit.

3. The charged particle beam device according claim 1 further comprising a deceleration unit for decelerating the beam of primary charged particles to a final beam energy.

4. The charged particle beam device according to claim 1 further comprising an electrode for providing a potential difference between the electrode and a specimen, thereby forming a deceleration unit.

5. The charged particle beam device according to claim 1, wherein the first low energy is approximately the same as a final beam landing energy.

6. The charged particle beam device according to claim 1, wherein the center unit is a ring or a cylinder.

7. The charged particle beam device according claim 6, wherein the ring or the cylinder is segmented.

8. The charged particle beam device according to claim 1, wherein the center unit is a grid.

9. The charged particle beam device according to claim 8, wherein the grid has a planar, convex or concave shape.

10. The charged particle beam device according to claim 1, wherein the first unit or the second unit are located close to a crossover of the beam of primary charged particles.

11. The charged particle beam device according to claim 2, wherein the first high energy or the second high energy is at least three times higher than a final beam landing energy.

12. The charged particle beam device according to claim 1, wherein a distance between the first unit and the second unit is less than 40 mm.

13. The charged particle beam device according to claim 1 further comprising a focusing unit for focusing the beam of primary charged particles on the specimen.

14. The charged particle beam device according to claim 13, wherein the focusing unit comprises a combined electrostatic-magnetic retarding field objective lens.

15. The charged particle beam device according to claim 1, wherein the first unit or the second unit are annular detectors.

16. The charged particle beam device according to claim 1, wherein the first high energy or the second high energy is at least 5 keV.

17. The charged particle beam device according to claim 1 further comprising a third unit, wherein the third unit is a detector for detecting charged particles.

18. The charged particle beam device according to claim 17, wherein the second unit is a detector and a detection side of the second unit is oriented towards the center unit.

19. The charged particle beam device according to claim 17, wherein a detection side of the third unit is oriented towards the specimen.

20. The charged particle beam device according to claim 1, wherein the first unit, the second unit and the center unit form a detection module and charged particles to be detected are decelerated within the detection module.

21. The charged particle beam device according to claim 1, wherein at least one detector is a segmented detector.

22. The charged particle beam device according to claim 1, wherein the second unit is a detector that is sensitive both from a topside and a lower side.

23. The charged particle beam device according to claim 1 further comprising a condenser lens.

24. A scanning electron microscope comprising a charged particle beam device, the charged particle beam device comprising:
    a charged particle source providing a beam of primary charged particles;
    a first unit for providing a first potential;
    a second unit for providing a second potential; and
    a center unit positioned between the first unit and the second unit, capable of providing a third potential different from the first and second potential to decelerate primary charged particles that arrive from a direction of the first unit to a first low energy and to accelerate the primary charged particles that propagate towards the second unit to a second high energy, wherein the first unit or the second unit is a detector for detecting charged particles released at a specimen.

25. The scanning electron microscope of claim 24, wherein the scanning microscope is adapted for low voltage applications.

26. A method for operating a charged particle beam device, comprising:
    providing a first potential at a first unit;
    providing a second potential at a second unit;
    providing a third potential at a center unit;
    generating a beam of primary charged particles;
    generating a beam of secondary and/or backscattered charged particles, wherein providing the third potential is adopted to decelerate the primary charged particles arriving from the first unit and to accelerate the primary charged particles towards the second unit, wherein providing the third potential is carried out at a position between a position of providing the first potential and a position of providing the second potential; and
    detecting the secondary or backscattered charged particles at the first unit or second unit.

27. The method according to claim 26, wherein the beam of secondary or backscattered charged particles is generated by directing the beam of primary charged particles onto a specimen.

28. The method according to claim 26, further comprising:
    detecting of the secondary or backscattered charged particles at a third unit.

29. Method according to claim 26 further comprising:
    decelerating the primary charged particles to a final beam landing energy.

30. The method according to claim 29, wherein providing the first potential, providing the second potential and providing the third potential are carried out such that the primary charged particles have approximately the same energy before passing the first unit and after passing the second unit, or the primary charged particles have approximately the same energy as the final beam landing energy when passing the center unit.

31. A method for analyzing a specimen comprising:
providing a first potential at a first unit;
providing a second potential at a second unit;
providing a third potential at a center unit;
generating a beam of primary charged particles;
generating a beam of secondary or backscattered charged particles;
directing the beam of primary charged particles to the specimen, thereby generating the beam of secondary or backscattered charged particles;
wherein providing the third potential is adopted to decelerate the primary charged particles arriving from the first unit and to accelerate the primary charged particles towards the second unit, wherein providing the third potential is carried out at a position between a position of providing the first potential and a position of providing the second potential; and
detecting the secondary or backscattered charged particles at the first unit or second unit.

* * * * *

UNITED STATES PATENT AND TRADEMARK OFFICE
CERTIFICATE OF CORRECTION

PATENT NO. : 7,544,937 B2  
APPLICATION NO. : 11/384043  
DATED : June 9, 2009  
INVENTOR(S) : Frosien Page 1 of 1

It is certified that error appears in the above-identified patent and that said Letters Patent is hereby corrected as shown below:

On the title page item (73):

Delete "GmbH" and insert --mbH-- therefor.

Signed and Sealed this

Eighteenth Day of August, 2009

David J. Kappos  
*Director of the United States Patent and Trademark Office*